(12) United States Patent
De Silva et al.

(10) Patent No.: US 11,302,573 B2
(45) Date of Patent: Apr. 12, 2022

(54) SEMICONDUCTOR STRUCTURE WITH FULLY ALIGNED VIAS

(71) Applicant: International Business Machines Corporation, Armonk, NY (US)

(72) Inventors: Ekmini Anuja De Silva, Slingerlands, NY (US); Ashim Dutta, Menands, NY (US); Praveen Joseph, Albany, NY (US); Nelson Felix, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 249 days.

(21) Appl. No.: 16/592,933

(22) Filed: Oct. 4, 2019

(65) Prior Publication Data

US 2021/0104432 A1    Apr. 8, 2021

(51) Int. Cl.
  *H01L 23/00* (2006.01)
  *H01L 21/768* (2006.01)
  *H01L 23/522* (2006.01)
  *H01L 23/532* (2006.01)

(52) U.S. Cl.
  CPC .. *H01L 21/76829* (2013.01); *H01L 21/76843* (2013.01); *H01L 21/76897* (2013.01); *H01L 23/5226* (2013.01); *H01L 23/53238* (2013.01); *H01L 23/53266* (2013.01)

(58) Field of Classification Search
  CPC ... H01L 24/82; H01L 23/5283; H01L 23/481; H01L 23/5226
  See application file for complete search history.

(56) References Cited

U.S. PATENT DOCUMENTS

| 7,651,942 | B2 * | 1/2010 | Huebinger | ........ H01L 21/02063 438/639 |
| 8,299,625 | B2 | 10/2012 | Ponoth et al. | |
| 9,324,650 | B2 | 4/2016 | Edelstein et al. | |
| | | | (Continued) | |

FOREIGN PATENT DOCUMENTS

EP    3399544 A1    11/2018

OTHER PUBLICATIONS

B.D. Briggs et al., "Fully Aligned Via Integration for Extendibility of Interconnects to Beyond the 7 nm Node," IEEE International Electron Devices Meeting (IEDM), Dec. 2-6, 2017, 4 pages.
(Continued)

*Primary Examiner* — Hoa B Trinh
(74) *Attorney, Agent, or Firm* — Abdy Raissinia; Ryan, Mason & Lewis, LLP

(57) ABSTRACT

A method of forming a semiconductor structure includes forming one or more interconnect lines, the one or more interconnect lines including trenches of a first metal material surrounded by a first interlayer dielectric layer. The method also includes forming pillars of a second metal material different than the first metal material over the one or more interconnect lines utilizing a metal on metal growth process, and forming an etch stop dielectric layer, the pillars of the second metal material shaping the etch stop dielectric layer. The method further includes forming one or more vias to the one or more interconnect lines, the one or more vias being fully aligned to the one or more interconnect lines using the etch stop dielectric layer.

20 Claims, 15 Drawing Sheets

(56) References Cited

U.S. PATENT DOCUMENTS

| | | |
|---|---|---|
| 9,607,893 B1 | 3/2017 | Zhang et al. |
| 9,966,337 B1 | 5/2018 | Briggs et al. |
| 10,109,524 B2 | 10/2018 | Witt |
| 10,177,028 B1 | 1/2019 | LiCausi et al. |
| 2015/0056800 A1 | 2/2015 | Mebarki et al. |
| 2015/0171010 A1 | 6/2015 | Bristol et al. |
| 2015/0318246 A1* | 11/2015 | Yu .................. H01L 25/065 257/774 |
| 2018/0040510 A1 | 2/2018 | Briggs et al. |
| 2018/0323102 A1 | 11/2018 | Redzheb et al. |

OTHER PUBLICATIONS

Disclosed Anonymously, "Bi-Directionally Self-Aligned Vias," IP.com, IPCOM000231097D, Sep. 26, 2013, 6 pages.

\* cited by examiner

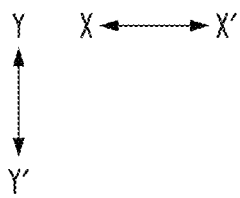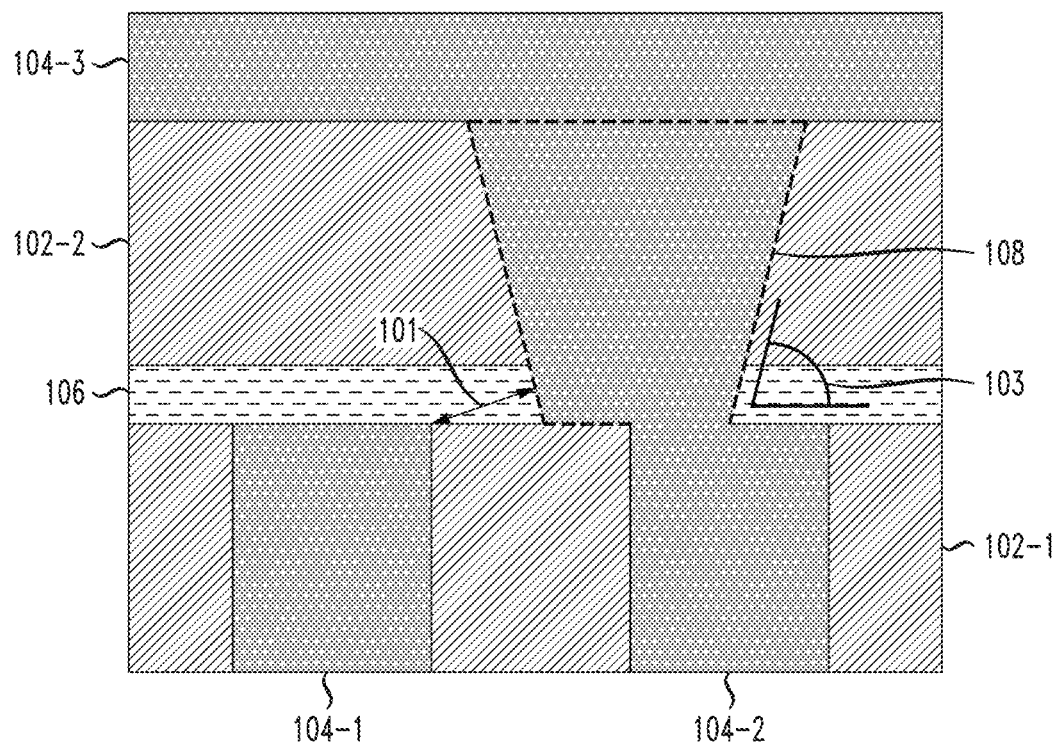
FIG. 1
100

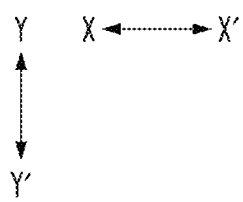
*FIG. 2*
200
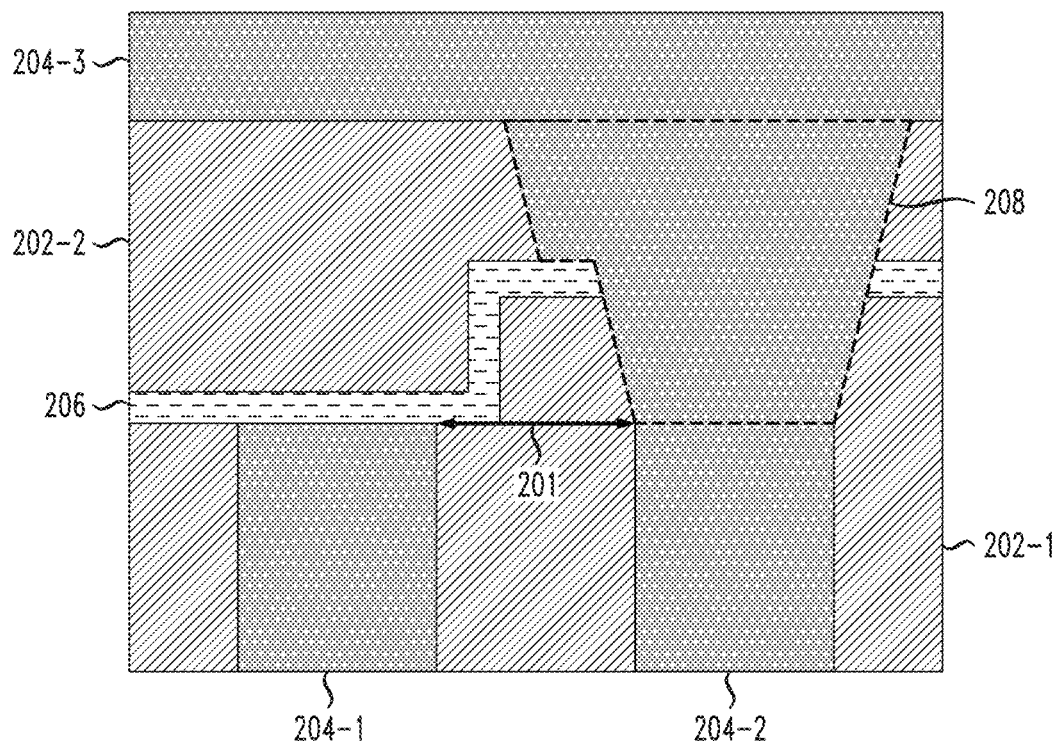

300

400

500

600

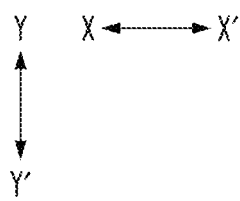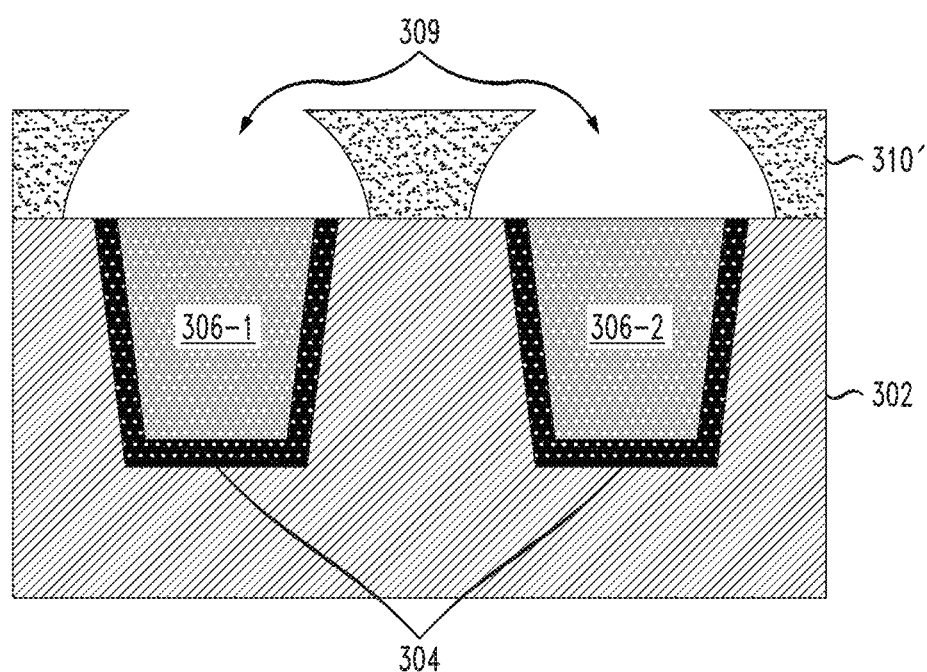

800

1000

1200

1300

1400

1500

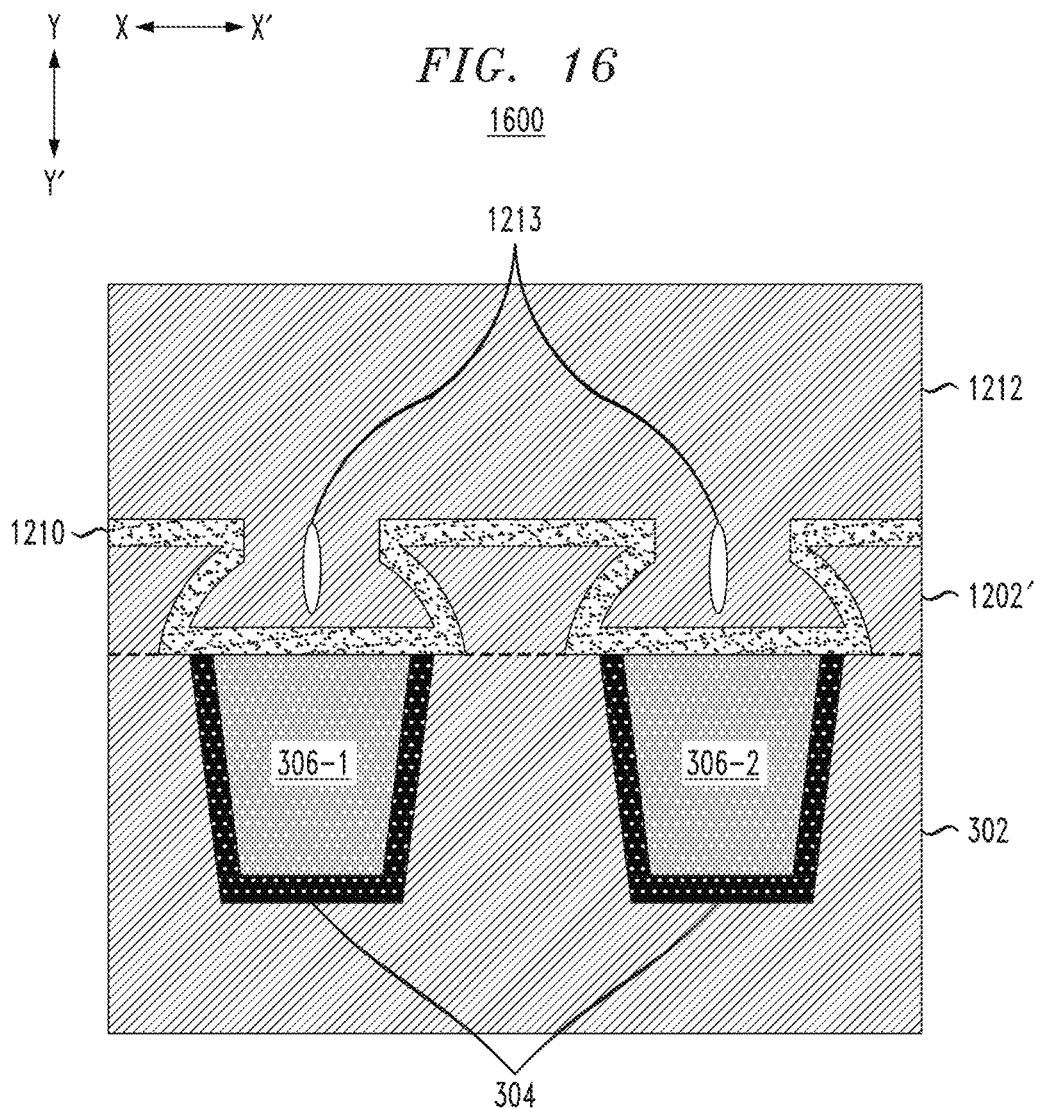

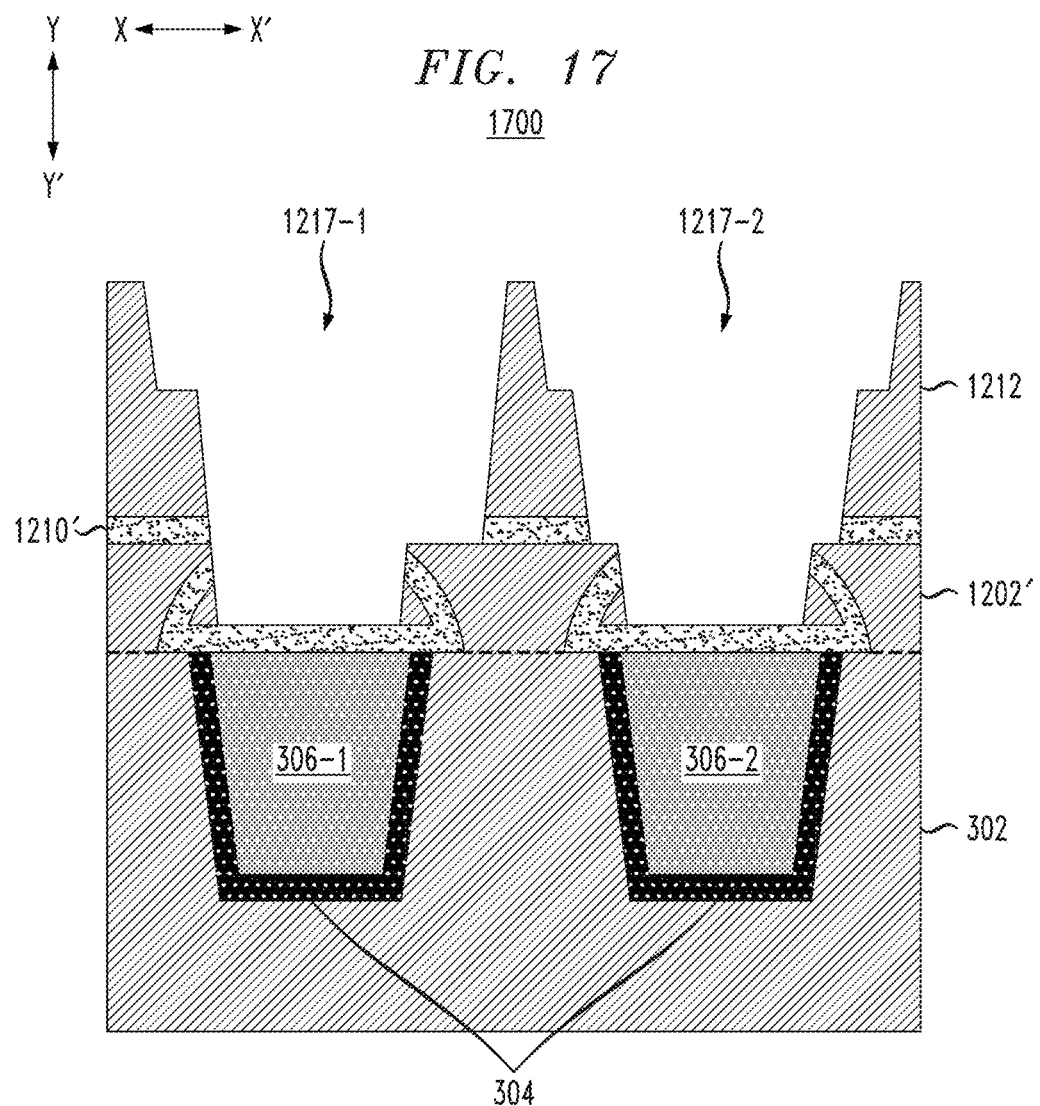

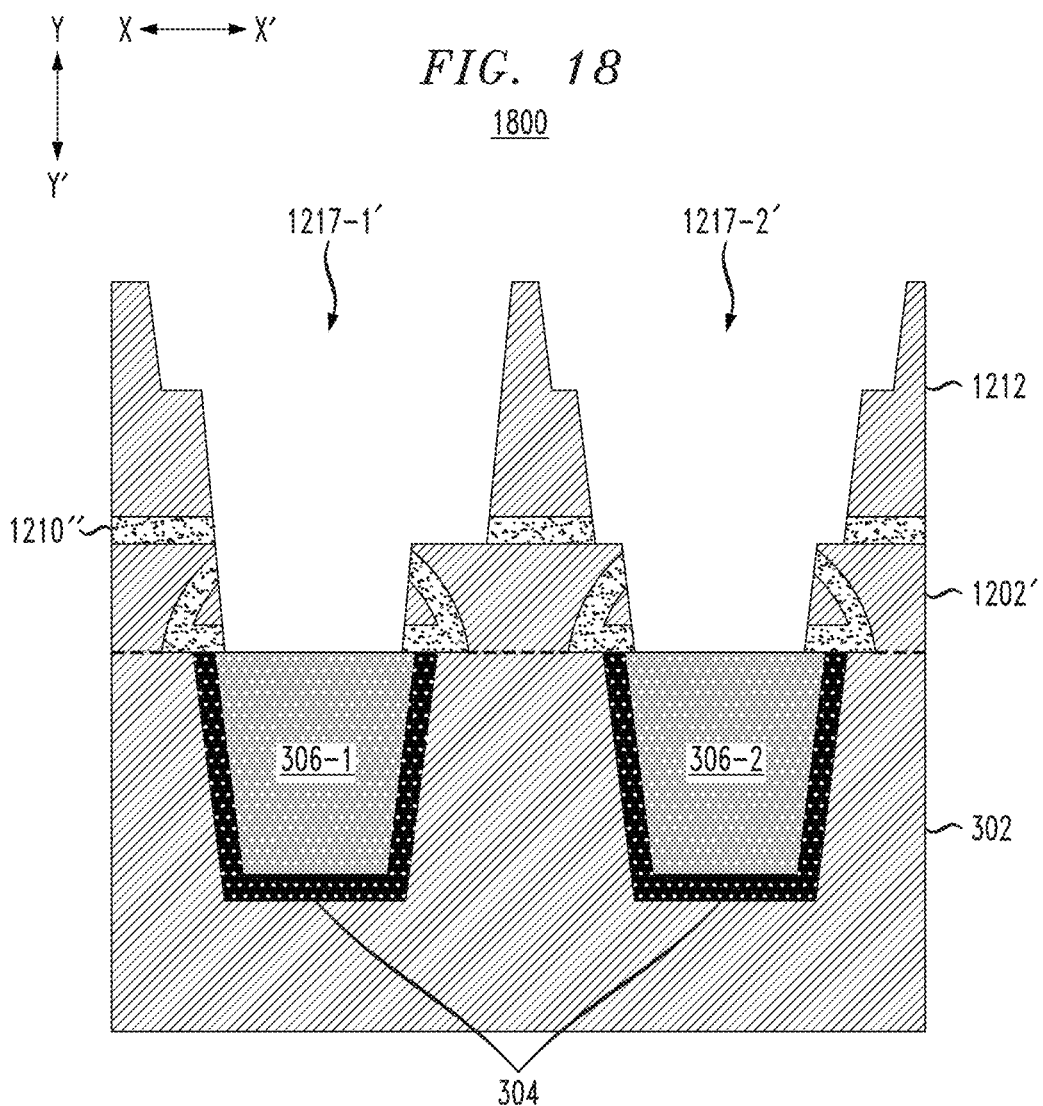

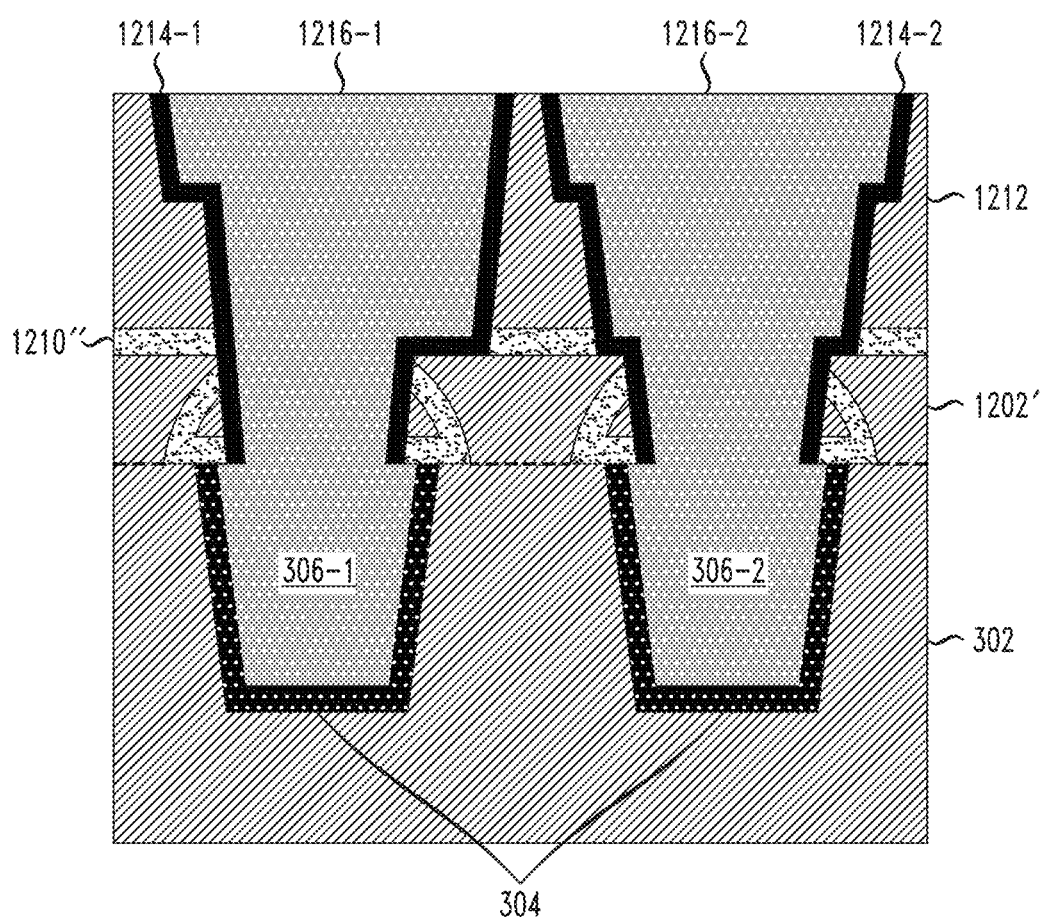

SEMICONDUCTOR STRUCTURE WITH FULLY ALIGNED VIAS

BACKGROUND

The present application relates to semiconductors, and more specifically, to techniques for forming semiconductor structures. Semiconductors and integrated circuit chips have become ubiquitous within many products, particularly as they continue to decrease in cost and size. There is a continued desire to reduce the size of structural features and/or to provide a greater amount of structural features for a given chip size. Miniaturization, in general, allows for increased performance at lower power levels and lower cost. Present technology is at or approaching atomic level scaling of certain micro-devices such as logic gates, field-effect transistors (FETs), and capacitors.

SUMMARY

Embodiments of the invention provide techniques for forming fully aligned vias.

In one embodiment, a method of forming a semiconductor structure comprises forming one or more interconnect lines, the one or more interconnect lines comprising trenches of a first metal material surrounded by a first interlayer dielectric layer. The method also comprises forming pillars of a second metal material different than the first metal material over the one or more interconnect lines utilizing a metal on metal growth process, and forming an etch stop dielectric layer, the pillars of the second metal material shaping the etch stop dielectric layer. The method further comprises forming one or more vias to the one or more interconnect lines, the one or more vias being fully aligned to the one or more interconnect lines using the etch stop dielectric layer.

In another embodiment, a semiconductor structure comprises a first interconnect level comprising one or more first interconnect lines surrounded by a first interlayer dielectric layer, a second interconnect level comprising one or more second interconnect lines, and one or more vias fully aligned to the one or more first interconnect lines in the first interconnect level and the one or more second interconnect lines in the second interconnect level through an etch stop dielectric layer. The etch stop dielectric layer defines an inverted bowl shape over the first interlayer dielectric layer surrounding each of the one or more first interconnect lines.

In another embodiment, an integrated circuit comprises an interconnect network comprising a first interconnect level comprising one or more first interconnect lines surrounded by a first interlayer dielectric layer, a second interconnect level comprising one or more second interconnect lines, and one or more vias fully aligned to the one or more first interconnect lines in the first interconnect level and the one or more second interconnect lines in the second interconnect level through an etch stop dielectric layer. The etch stop dielectric layer defines an inverted bowl shape over the first interlayer dielectric layer surrounding each of the one or more first interconnect lines.

BRIEF DESCRIPTION OF THE DRAWINGS

FIG. 1 depicts a side cross-sectional view of a self-aligned via connecting metal lines in first and second interconnect levels of a semiconductor structure, according to an embodiment of the invention.

FIG. 2 depicts a side cross-sectional view of a fully aligned via connecting metal lines in first and second interconnect levels of a semiconductor structure, according to an embodiment of the invention.

FIG. 7 depicts a side cross-sectional view of the FIG. 6 structure following removal of the selectively grown metal formed over the metal lines in the first interconnect level, according to an embodiment of the invention.

FIG. 16 depicts a side cross-sectional view of the FIG. 15 structure following deposition of a dielectric layer, according to an embodiment of the invention.

FIG. 17 depicts a side cross-sectional view of the FIG. 16 structure following dual-damascene trench and via patterning, according to an embodiment of the invention.

FIG. 18 depicts a side cross-sectional view of the FIG. 17 structure following removal of the etch stop liner to expose top surfaces of the metal lines in the first interconnect layer, according to an embodiment of the invention.

FIG. 19 depicts a side cross-sectional view of the FIG. 18 structure following formation of a metal liner and fill with a metal to form fully aligned vias in the dual-damascene patterned trenches and vias, according to an embodiment of the invention.

DETAILED DESCRIPTION

Figure 3:
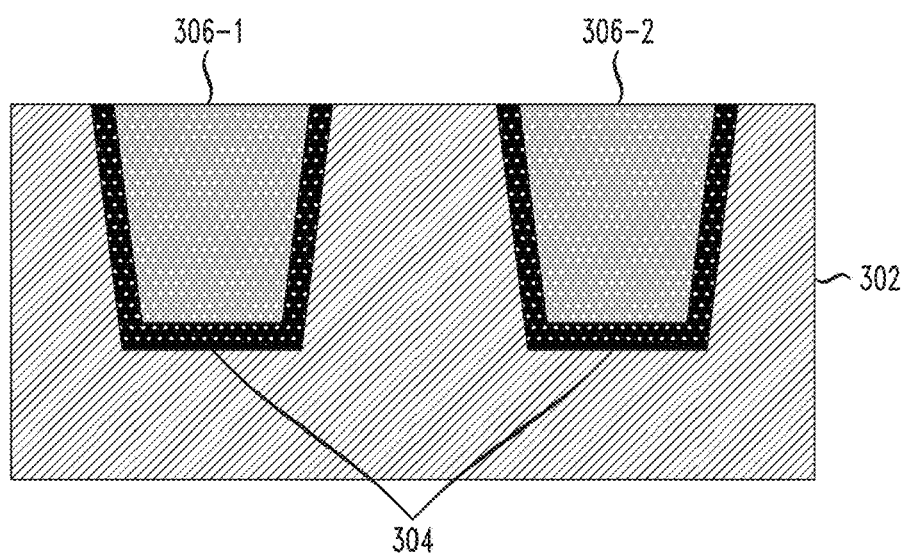
FIG. 3 depicts a side cross-sectional view of metal lines formed in a first interconnect level of a semiconductor structure, according to an embodiment of the invention.

Illustrative embodiments of the invention may be described herein in the context of illustrative methods for forming fully aligned vias, along with illustrative apparatus, systems and devices formed using such methods. However, it is to be understood that embodiments of the invention are not limited to the illustrative methods, apparatus, systems and devices but instead are more broadly applicable to other suitable methods, apparatus, systems and devices.

In semiconductor fabrication processes, a large number of semiconductor devices and conductive interconnect layers are formed in and on a single wafer or substrate. Such conductive interconnect layers provide a network of pathways that transport signals throughout an integrated circuit (e.g., connecting circuit components of an integrated circuit). Different interconnect layers may be connected to one another via a set of vias formed through the wafer. As feature sizes continue to decrease, the aspect ratio (e.g., a ratio height or depth to width) of features such as vias generally increases. It is difficult to fabricate complex structures with multiple interconnect layers and vias connecting such layers within increasingly smaller wafer footprints.

To fabricate very large scale integrated (VLSI) or ultra large scale integrated (VLSI) circuits, complex interconnect structures are required. Such interconnect structures may include a wiring interconnect network (e.g., of metallic wiring) for coupling different devices and features of devices to one another. The wiring interconnect network may include "line" features that traverse a distance across a level of a semiconductor structure, as well as "via" features that connect line features in different levels. The line features, also referred to as metal lines, may be formed of aluminum (Al), copper (Cu), tungsten (W) or another suitable material that is electrically insulated by interlayer dielectric (ILD) layers. The via features are referred to herein as being in "V" layers of a semiconductor structure, while the line features are referred to as being in "M" layers of the semiconductor structure.

To improve performance, the size of various features of a semiconductor structure (also referred to herein as a semiconductor chip) continue to scale. For example, transistor gate length and chip size overall continue to shrink. As a result, the interconnect structures must also shrink, which causes the aspect ratio of via features to generally increase. To improve manufacturability, lithography fabrication may utilize advanced masks that incorporate phase-shifting and optical proximity correction. As the size scale of interconnect structures decreases, overlay error between features in the interconnect structure can lead to various reliability issues. Overlay errors may result from misalignment during lithography processes, as the masks may become misaligned with the underlying structure. Although overlay errors can be reduced be re-working lithography operations, it is generally not feasible to entirely avoid some level of overlay error.

Various failure modes for interconnects may result from overlay errors of lithographic patterns, including electromigration (EM) and time dependent dielectric breakdown (TDDB). EM failure is a result of a void forming in a conductive metal feature through metal diffusion, leading to a short or very high resistance. EM is highly dependent on a current density and cross-section of metal features. If interconnect wiring is constructed such that the intersections between vias and lines are too small, smaller voids formed by EM can lead to failure and shortening the EM lifetime. TDDB failure is a result of insulating materials or layers no longer serving as adequate electrical insulators, leading to unintended conductance between two adjacent metal features. TDDB is highly dependent on the electrical field between metal features, as regions with higher electrical fields are more susceptible to TDDB failure. Thus, it is desired to control the spacing between conducting metal features to keep associated electrical fields to tolerable levels.

To mitigate via misalignment and associated device failures, some embodiments utilize fully aligned vias. A fully aligned via is a vertical metal line interconnect (e.g., Vx) that is "fully aligned" to both an Mx interconnect level and an Mx+1 interconnect level. FIGS. 1 and 2 illustrate side cross-sectional views 100 and 200, respectively, of a self-aligned via (SAV) and a fully aligned via (FAV).

As shown in FIG. 1, metal lines 104-1 and 104-2 of a first interconnect level, Mx, are formed surrounded by a first ILD layer 102-1. A SAV 108 (e.g., Vx) is formed to connect the metal line 104-2 to a metal line 104-3 in a second interconnect level, Mx+1. The SAV 108 is surrounded by ILD 102-2, and a capping layer 106 is provided.

The ILD layers 102-1 and 102-2 (collectively, ILD layers 102) may be formed of any suitable dielectric material, including but not limited to porous silicates, carbon-doped oxides, silicon dioxide ($SiO_2$), silicon nitride (SiN), silicon oxynitride (SiON), etc. The ILD layers 102 may be formed using any suitable deposition process, including but not limited to chemical vapor deposition (CVD), plasma-enhanced CVD (PECVD), atomic layer deposition (ALD), physical vapor deposition (PVD), etc.

The metal lines 104-1, 104-2 and 104-3 (collectively, metal lines 104) may be formed of Al, Cu, W, ruthenium (Ru), molybdenum (Mo), rhodium (Rh), or another suitable material. Each of the metal lines 104-1 and 104-2 may have a horizontal thickness or width (in direction X-X') that is generally below 20 nanometers (nm), or in the range of about 10 nm to 20 nm, and a vertical thickness or height (in direction Y-Y') in the range of about 30 nm to 60 nm. The metal line 104-3 may have a vertical thickness or height (in direction Y-Y') in the range of about 10 nm to 20 nm. The metal lines 104 may be formed using any suitable deposition process, including using single and dual damascening techniques. In some embodiments, one or more of the metal lines 104, such as metal lines 104-1 and 104-2, may be formed with a barrier metal liner and a metal formed over the barrier metal liner. The metal may be Al, Cu, W as described above, where the barrier metal liner is tantalum (Ta), tantalum nitride (TaN), titanium (Ti), titanium nitride (TiN), cobalt (Co), Ru, manganese (Mn), etc. The barrier metal liner in such cases may have a thickness in the range of about 1 nm to 10 nm. The barrier metal liner may also be referred to as a barrier layer or metal liner, and is configured to prevent diffusion of the metal into surrounding dielectric material.

The capping layer 106 may be formed of a dielectric material such as sacrificial silicon nitride (SiN), silicon oxide ($SiO_x$) or silicon oxynitride (SiON), with a thickness (in direction Y-Y') in the range of about 5 nm to 20 nm. The capping layer 106 may be formed using CVD, ALD or another suitable deposition type.

The SAV 108 may be formed of material similar to that of the metal lines 104 (and may, in some cases, also include a metal liner). The SAV 108 has sloped sidewalls, with a bottom surface proximate a top surface of the metal line 104-2 that is narrower than a top surface proximate a bottom surface of the metal line 104-3. The bottom width of the SAV 108 proximate the top surface of the metal line 104-2 may be in the range of about 10 nm to 40 nm while the top width of the SAV 108 proximate the bottom surface of the metal line 104-3 may be in the range of about 5 nm to 20 nm. The distance between the SAV 108 and the metal line 104-1 is denoted 101, and the angle of the SAV 108 to the top surface of the metal line 104-2 is denoted 103. The angle 103 may be, for example, 65°. Due to mis-alignment where the SAV 108 is not fully aligned to the metal line 104-2, the distance 101 is relatively small and may contribute to overlay errors as described above.

FIG. 2 shows a structure similar to that of FIG. 1, with ILD layers 202-1 and 202-2 (collectively, ILD layers 202), metal lines 204-1 and 204-2 in a first interconnect level Mx, and a metal line 204-3 in a second interconnect level Mx+1. The metal lines 204-1, 204-2 and 204-3 are collectively referred to as metal lines 204. The ILD layers 202 and metal lines 204 may be formed of similar materials, with similar processing and similar sizing as that described above with respect to ILD layers 102 and metal lines 104.

The FIG. 2 structure also includes a capping layer 206, which may be formed with similar processing and sizing as that described above with respect to capping layer 106. The shape of the capping layer 206, however, may vary. As shown in FIG. 2, the capping layer 206 has a stepped structure with a first horizontal portion over the metal line 204-1 and a portion of the surrounding ILD 202-1, a second vertical portion, and a third horizontal portion spaced apart from a top surface of the metal line 204-2. The capping layer 206 provides a conformal dielectric etch resistant capping, and may be formed of a metal oxide or nitride such as aluminum oxide ($AlO_x$), aluminum nitride (AlN), titanium oxide (TiOx), titanium nitride (TiN), etc. The capping layer 206 may also be formed of materials similar to those of capping layer 106, such as SiN, $SiO_x$, SiON, etc.

Whereas the FIG. 1 structure has a SAV 108 connecting metal line 104-2 to metal line 104-3, the FIG. 2 structure has a FAV 208 connecting metal line 204-2 to metal line 204-3. The FAV 208 has its bottom surface fully aligned with a top surface of the metal line 204-2, rather than being offset or partially misaligned as with the SAV 108 of FIG. 1. As a result, the spacing 201 between the metal line 204-1 and the FAV 208 is greater than the spacing 101 between the metal line 104-1 and the SAV 108, even where the distance between the metal line 104-1 and metal line 104-2 is the same as the distance between the metal line 204-1 and metal line 204-2.

FAVs such as FAV 208 may be formed by leveraging the underlying Mx topography. For example, metal lines and associated liners of an Mx layer may be formed surrounded by an ILD layer. The metal lines and associated liners may then be recessed below a top surface of the surrounding ILD, and a capping layer may be formed over the structure. Next, another ILD layer may be formed over the capping layer, followed by a set of hard mask layers (e.g., first and second hard mask layers for patterning desired interconnections). A photoresist is patterned over the hard mask layers and used to recess exposed portions of the hard mask layers and at least a portion of the ILD layer formed over the capping layer in regions where FAVs to the metal lines in the Mx layer are to be formed. Next, the photoresist may be stripped and a pattern of the uppermost hard mask layer may be transferred to the underlying hard mask layers and ILD layer. This will result in removal of the capping layer to expose the underlying metal lines in the Mx layer (from the recessed portion of the ILD layer formed via etching regions exposed by the photoresist). Material for the FAV (including an associated metal liner, if desired) are then formed.

Various etch chemistries may be used to recess the metal lines and metal liners in the Mx interconnect level. For example, an etch chemistry such as a reactive-ion etch (RIE) or specialized wet chemistry may be used to simultaneously recess a Cu metal line and Co liner or a Cu metal line and a Ru liner. Such dry and wet etch processes for various barrier or liner and metal line combinations, however, are difficult to control and thus represent process challenges for forming FAVs using the above-described technique Mx "recessing" techniques.

Techniques for forming FAVs using a selective insulator on insulator process are an alternative to performing metal recess. Current tooling, however, is not able to perform such selective insulator on insulator processing.

Illustrative embodiments provide techniques for forming FAVs that utilize preferential metal growth, rather than metal recess or selective insulator on insulator processing. A topography is created above metal-filled Mx interconnect level trenches through metal-on-metal growth (e.g., TiN or TaN growth on Cu). In some embodiments, an etch stop dielectric is deposited to fill spaces between the metal topography above the Mx interconnect level, followed by CMP for planarization. The metal topography above the Mx interconnect level is then pulled, creating a recessed topography for FAV formation. In other embodiments, the recessed topography may be formed in back-end-of-line (BEOL) dielectric, followed by formation of a thin conformal liner of an etch stop material inside the recess formed by pulling the metal topography to form the final FAV structure.

Advantageously, in such structures vias are fully self-aligned with underlying trenches through an alternative dielectric (e.g., an etch stop layer) that has an inverted wine glass or inverted bowl shape. In some embodiments, the inverted wine glass shape is completely in an alternative dielectric material (e.g., an etch stop dielectric). In other embodiments, the inverted wine glass shape is in a bulk BEOL dielectric (e.g., an ultra low-k dielectric) with a liner of alternative dielectric material (e.g., an etch stop dielectric liner).

Illustrative processes for forming FAVs using preferential metal growth will now be described in further detail with respect to FIGS. 3-18.

FIG. 3 shows a side cross-sectional view 300 of a semiconductor structure including an ILD layer 302, in which metal line interconnects comprising a metal liner 304 and metal lines 306-1 and 306-2 are formed. The ILD layer 302 may be formed of similar materials and with similar processing as that described above with respect to ILD layers 102. The metal liner 304 may comprise Ta, TaN, Ti, TiN, Co, Ru, Mn or another suitable material such. The metal liner 304 may have a thickness in the range of about 1 nm to 10 nm. The metal liner 304 may be formed using CVD, PVD, ALD, plasma enhanced ALD (PEALD), evaporation, chemical solution deposition or other suitable processes including combinations of these deposition types.

The metal lines 306 may be formed of Cu, Al, W, Ru, Rh, Mo, Co or another suitable material. The metal lines 306 may each have a vertical thickness or height (in direction Y-Y') in the range of about 30 nm to 150 nm. Each of the metal lines 306 has tapered sidewalls, with a top surface proximate the top surface of the ILD layer 302 having a horizontal thickness or width (in direction X-X') in the range of about 25 nm to 250 nm, and a bottom surface having a horizontal thickness or width (in direction X-X') that tapers as illustrated.

The metal lines 306 in the FIG. 3 structure are assumed to be in an Mx interconnect level of a semiconductor chip. The FIG. 3 structure is shown after chemical mechanical planarization (CMP) of the Mx interconnect level, such that the top surfaces of the ILD layer 302, metal liner 304 and metal lines 306 are substantially the same.

Figure 4:
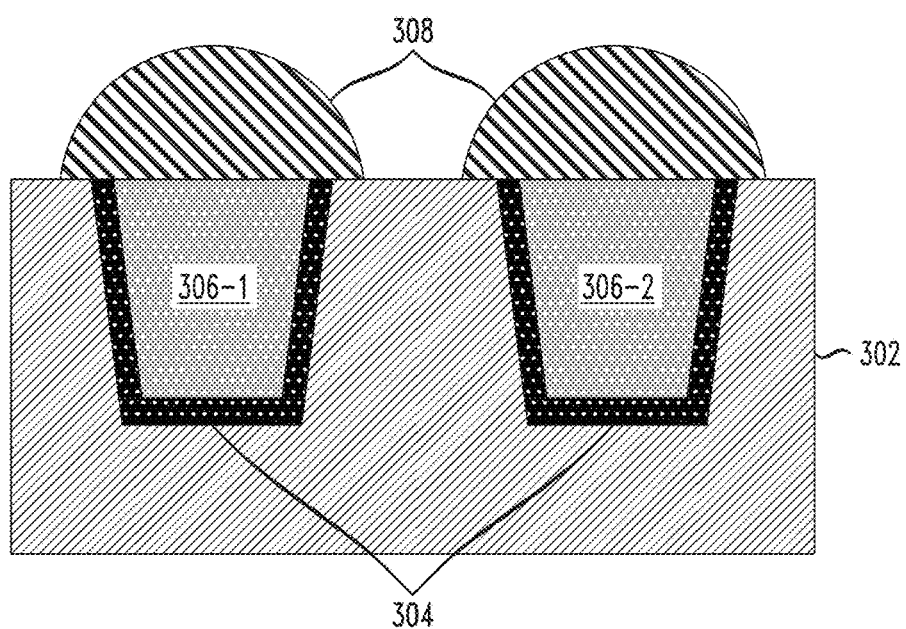
FIG. 4 depicts a side cross-sectional view of the FIG. 3 structure following selective metal-on-metal growth over the metal lines formed in the first interconnect level, according to an embodiment of the invention.

FIG. 4 shows a side cross-sectional view 400 of the FIG. 3 structure following selective metal on metal growth of pillars 308 over the metal lines 306 and metal liner 304 of the first interconnect level. The pillars 308 may be formed using a selective or preferential metal growth process such as CVD, ALD, PEALD or other suitable processing. The pillars 308 may be formed of TaN, TiN or another suitable material such as Ta, Ti, Ru, etc. As shown in FIG. 4, the pillars 308 may be rounded, where the vertical thickness or height (in direction Y-Y') is tallest (e.g., in the range of about 2 nm to 20 nm) proximate the middle of each of the metal lines 306, tapering down as distance from the middle of each of the metal lines 306 increases. The horizontal width or thickness (in direction –X') of the pillars 308, at their widest, is in the range of about 10 nm to 20 nm. It is assumed that the metal lines 306 formed in the first interconnect level are spaced apart from one another sufficiently such that the pillars 308 formed over each of the metal lines 306 do not merge with one another. In some embodiments, the distance between the metal lines (in direction X-X') is in the range of about 5 m to 20 nm. The growth of pillars 308 may also be controlled such that the pillars 308 do not merge with one another.

Figure 5:
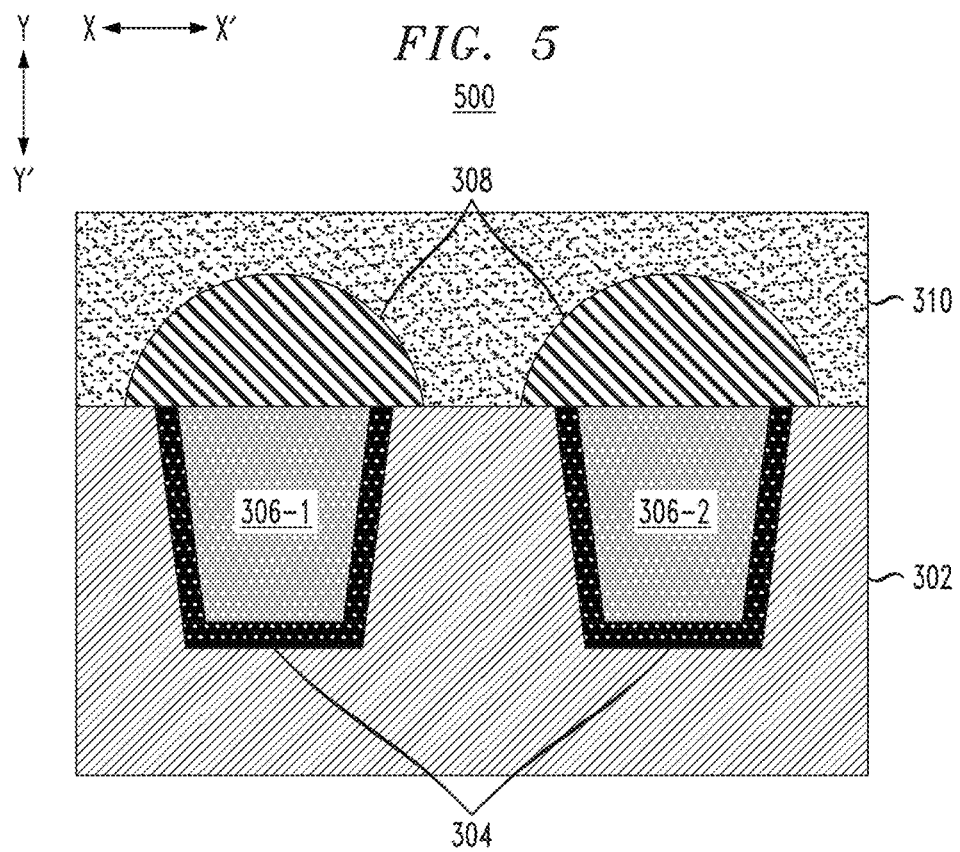
FIG. 5 depicts a side cross-sectional view of the FIG. 4 structure following formation of an etch stop dielectric layer, according to an embodiment of the invention.

FIG. 5 shows a side cross-sectional view 500 of the FIG. 4 structure following formation of an etch stop dielectric layer 310 over the pillars 308 and the top surface of the ILD 302 exposed by the pillars 308. The etch stop dielectric layer 310 may be formed using a gap fill process, such as flowable CVD (FCVD). The etch stop dielectric layer 310 may be formed of AlN, AlO$_x$ or another suitable material. The etch stop dielectric layer 310 may have a vertical thickness or height (in direction Y-Y') in the range of about 5 nm to 100 nm, such that the etch stop dielectric layer 310 overfills the pillars 308.

Figure 6:
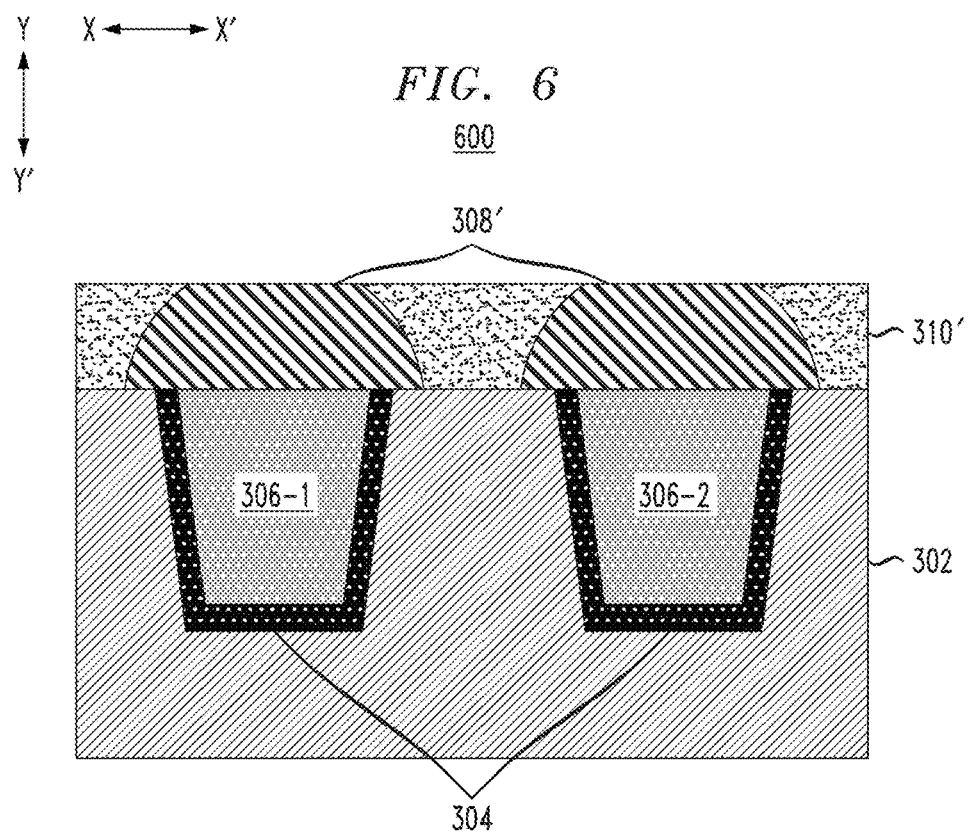
FIG. 6 depicts a side cross-sectional view of the FIG. 5 structure following planarization, according to an embodiment of the invention.

FIG. 6 shows a side cross-sectional view 600 of the FIG. 5 structure following planarization. Various processing techniques may be used to planarize the pillars 308 and etch stop dielectric layer 310 as illustrated in FIG. 6, including using CMP, etch-back processing, combinations thereof, etc. The pillars 308 and etch stop dielectric layer 310 are planarized such that the resulting pillars 308' and etch stop dielectric layer 310' each have a vertical thickness or height (in direction Y-Y') in the range of about 2 nm to 20 nm.

FIG. 7 shows a side cross-sectional view 700 of the FIG. 6 structure following removal of the pillars 308'. The pillars 308' may be removed using a metal pull RIE chemistry or a suitable wet chemistry, resulting in gaps 309 surrounded by the etch stop dielectric layer 310'.

Figure 8:
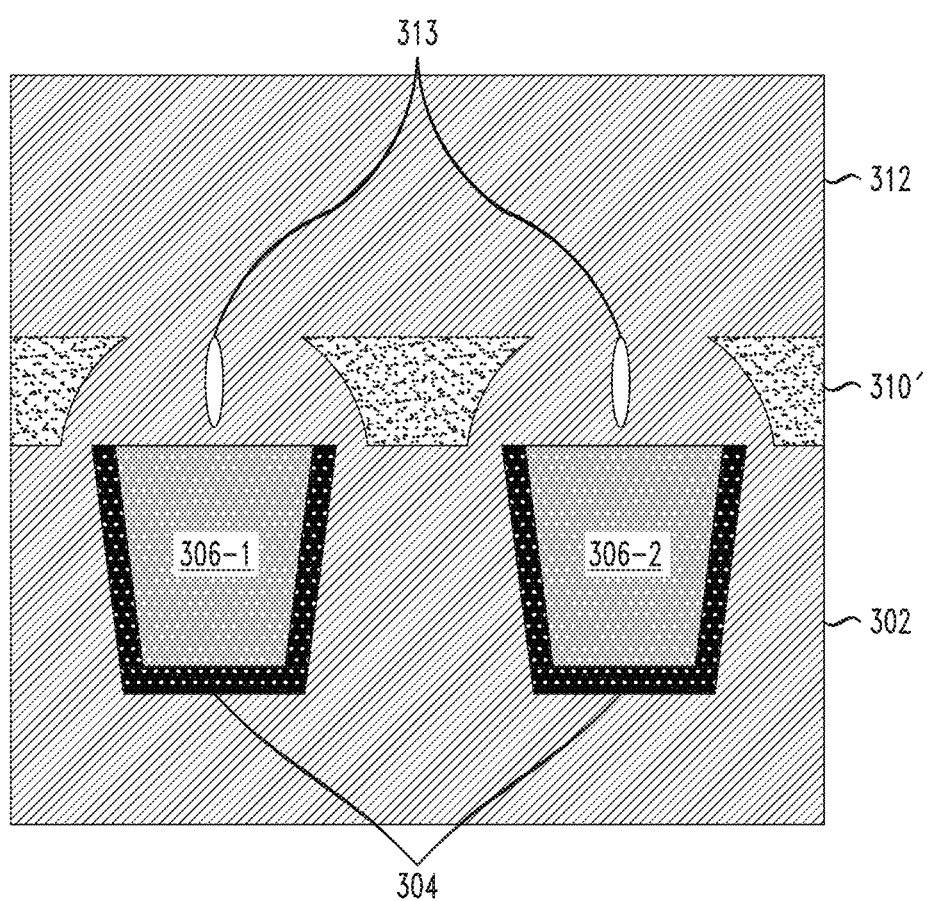
FIG. 8 depicts a side cross-sectional view of the FIG. 7 structure following a dielectric fill, according to an embodiment of the invention.

FIG. 8 shows a side cross-sectional view 800 of the FIG. 7 structure following fill with an ILD layer 312. The ILD layer 312 may be formed of a BEOL dielectric such as a porous silicate, carbon-doped oxides, silicon oxides, silicon nitrides, silicon oxy nitrides, etc. As shown, when deposited (e.g., using CVD, ALD, PECVD, PEALD, solution casting, etc.), the ILD layer 312 may pinch off resulting in air gaps 313 as shown.

Figure 9:
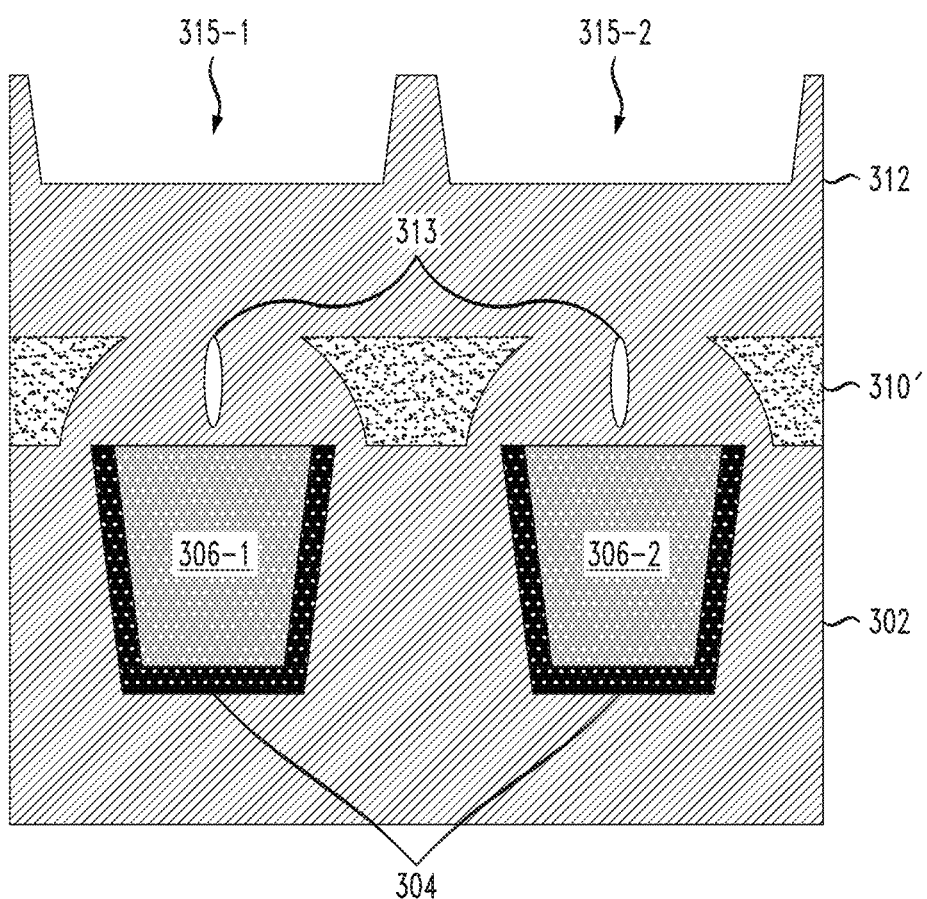
FIG. 9 depicts a side cross-sectional view of the FIG. 8 structure following dual-damascene trench patterning, according to an embodiment of the invention.

FIG. 9 shows a side cross-sectional view 900 of the FIG. 8 structure following dual-damascene trench patterning to form trenches 315-1 and 315-2 (collectively, trenches 315) in the ILD layer 312. The trench patterning may include patterning a photoresist layer over a top surface of the ILD 312, then etching exposed portions of the ILD 312 to result in the trenches 315. The trenches 315 may each have a horizontal thickness or width (in direction X-X') that tapers from a wider portion proximate the top thereof to a narrower portion proximate the bottom thereof. The wider top of the trenches 315 may be in the range of about 5 nm to 40 nm, and the narrow bottom of the trenches 315 may be in the range of about 5 nm to 20 nm.

It should be appreciated that the trenches 315 need not be perfectly aligned with the underlying metal lines 306 that the FAV is formed to. As shown, the trench 315-1 is slightly off center relative to the underlying metal line 306-1 while the trench 315-2 is centered over the underlying metal line 306-2. In other embodiments, however, all trenches may be centered over their underlying metal lines, or all trenches may be off-center relative to their underlying metal lines. When misalignment occurs, the FAV formed may be off center and touching the edge of the trench that it is protected by.

Figure 10:
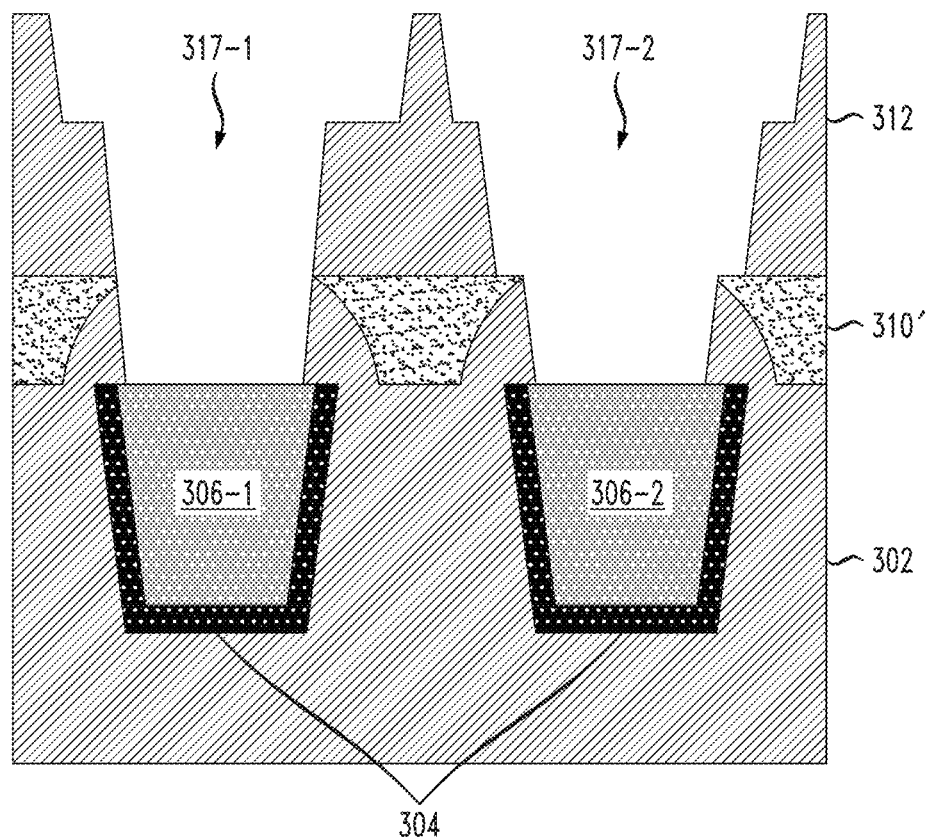
FIG. 10 depicts a side cross-sectional view of the FIG. 9 structure following dual-damascene via patterning, according to an embodiment of the invention.

FIG. 10 shows a side cross-sectional view 1000 of the FIG. 9 structure following dual-damascene via patterning of vias 317-1 and 317-2 (collectively, vias 317) in the ILD layer 312 below the trenches 315. To form the vias 317, RIE or other suitable processing may be used. The vias 317, similar to the trenches 315, have tapered sidewalls. The vias 317 are narrower (in direction X-X') than the trenches 315. For example, at their widest the vias 317 may have a horizontal thickness or width (in direction X-X') in the range of about 5 nm to 30 nm. Via 317-1 and via 317-2 have differing shapes, as a result of mis-alignment as noted above. As a result, the via 317-1 is shifted to the right due to lithographic alignment issues. The etch stop layer 310' prevents the via 317-1 from extending past the edge of the metal line 306-1 as illustrated.

Figure 11:
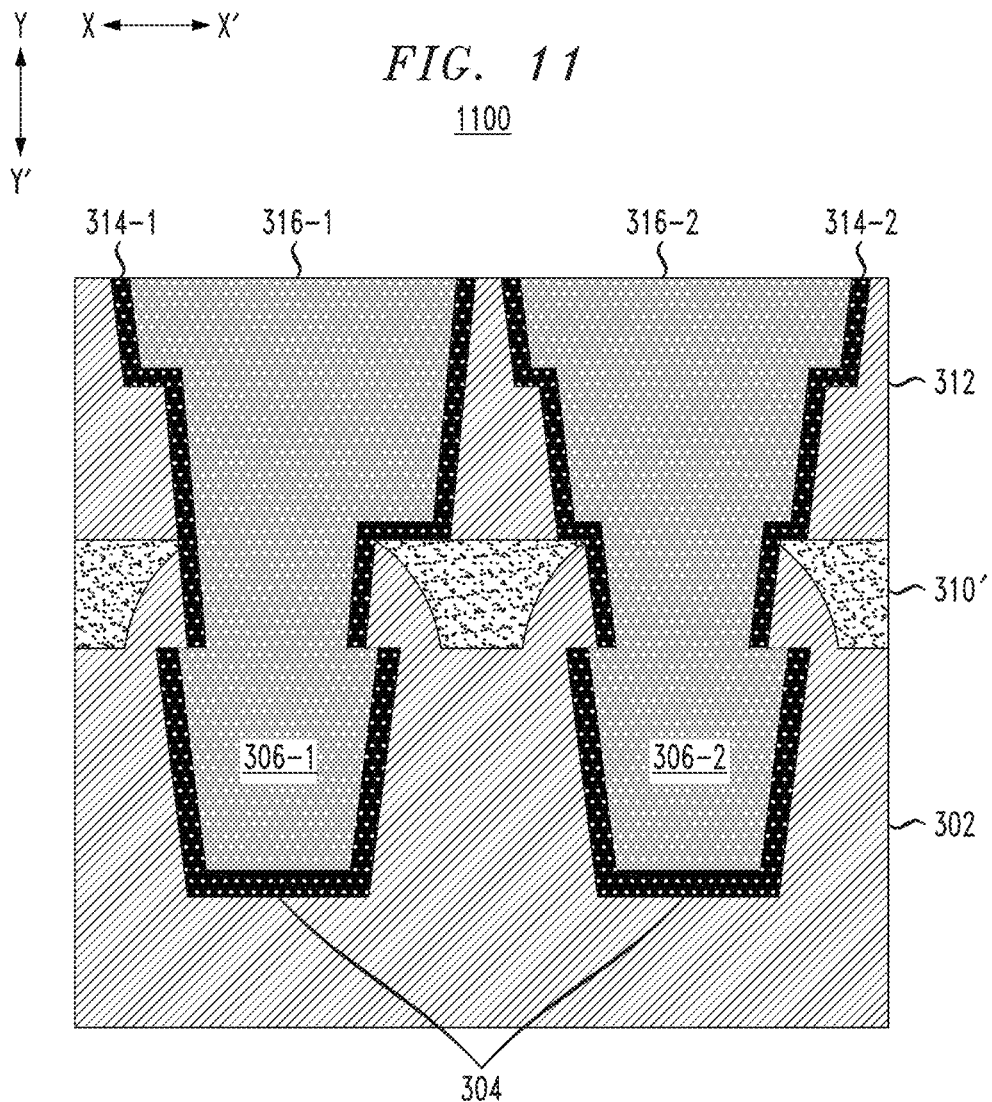
FIG. 11 depicts a side-cross sectional view of the FIG. 10 structure following formation of a metal liner and fill with a metal to form fully aligned vias in the dual-damascene patterned trenches and vias, according to an embodiment of the invention.

FIG. 11 shows a side cross-sectional view 1100 of the FIG. 10 structure following formation of additional metal liners 314-1 and 314-2 (e.g., on sidewalls of the dual-damascene patterned trenches 315 and vias 317) followed by fill with a metal 316-1 and 316-2 providing FAVs to the metal lines 306-1 and 306-2, respectively, in the first interconnect level. The metal liners 314-1 and 314-2 (collectively, metal liners 314) may be formed of similar materials, with similar sizing and similar processing as that described above with respect to metal liner 304. The metal vias 316-1 and 316-2 (collectively, metal vias 316) may be formed of similar materials and with similar processing as that described above with respect to metal lines 306.

Figure 12:
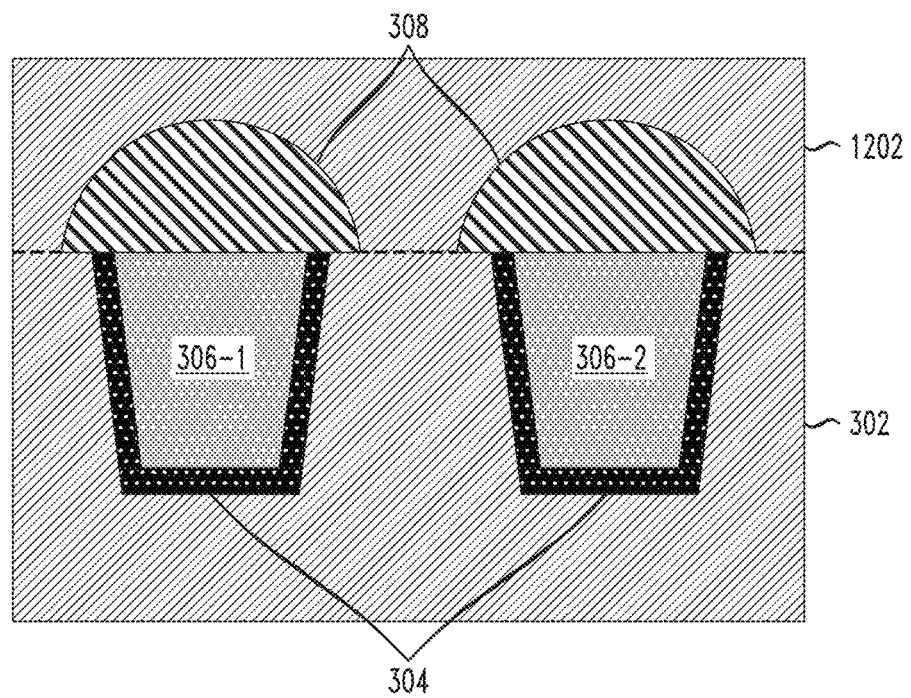
FIG. 12 depicts a side cross-sectional view of the FIG. 4 structure following deposition of a dielectric layer, according to an embodiment of the invention.

FIG. 12 shows a side cross-sectional view 1200 of the FIG. 4 structure, following deposition of a dielectric layer 1202. The dielectric layer 1202 may be a bulk BEOL dielectric, formed of an ultra low-k dielectric material. The dielectric layer 1202 may be formed using a gap fill process, such as FCVD. The dielectric layer 1202 may have a vertical thickness or height (in direction Y-Y') similar to that of etch stop dielectric layer 308 described above. In some cases, the dielectric layer 1202 is formed of the same material as ILD layer 302. A dashed line is shown in FIG. 12 and subsequent figures to show where the dielectric layer 1202 is formed relative to the existing ILD layer 302.

Figure 13:
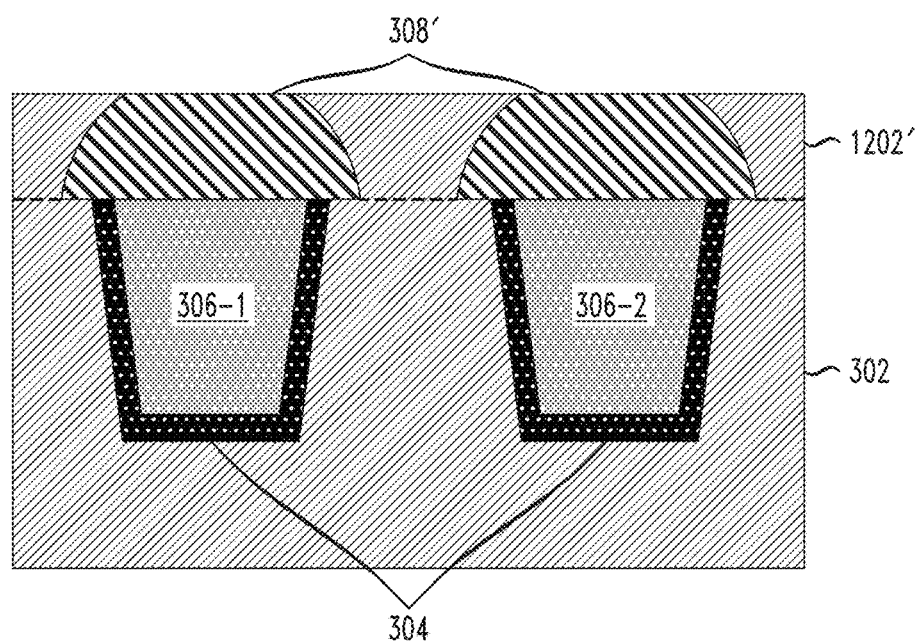
FIG. 13 depicts a side cross-sectional view of the FIG. 12 structure following planarization, according to an embodiment of the invention.

FIG. 13 shows a side cross-sectional view 1300 of the FIG. 12 structure following planarization, where the pillars 308 are planarized using CMP and the dielectric layer 1202 is planarized using etch-back processing to result in pillars 308' and dielectric layer 1202' similar to that described above with respect to FIG. 6.

Figure 14:
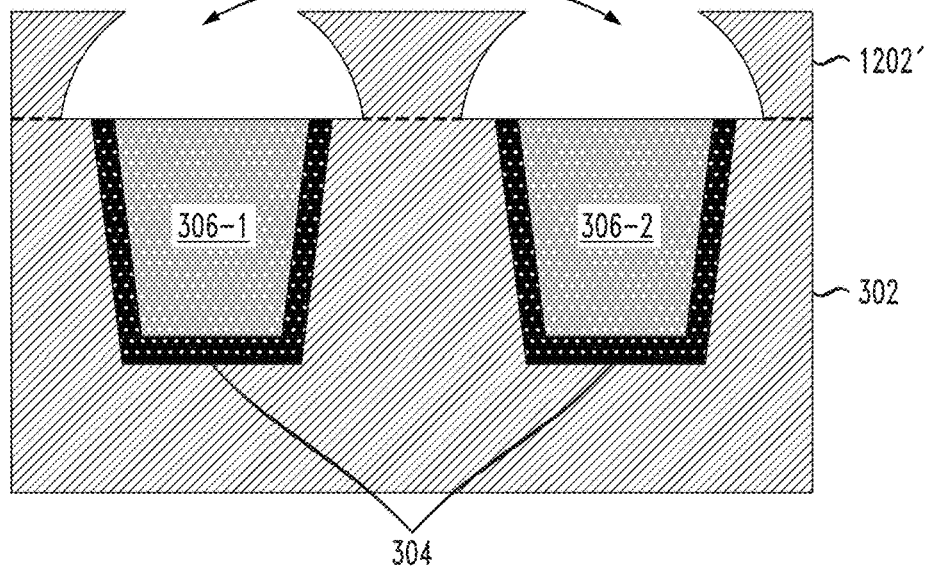
FIG. 14 depicts a side cross-sectional view of the FIG. 13 structure following removal of the selectively grown metal formed over the metal lines in the first interconnect level, according to an embodiment of the invention.

FIG. 14 shows a side cross-sectional view 1400 of the FIG. 13 structure following removal of the pillars 308' forming gaps 309, using processing similar to that described above with respect to FIG. 7.

Figure 15:
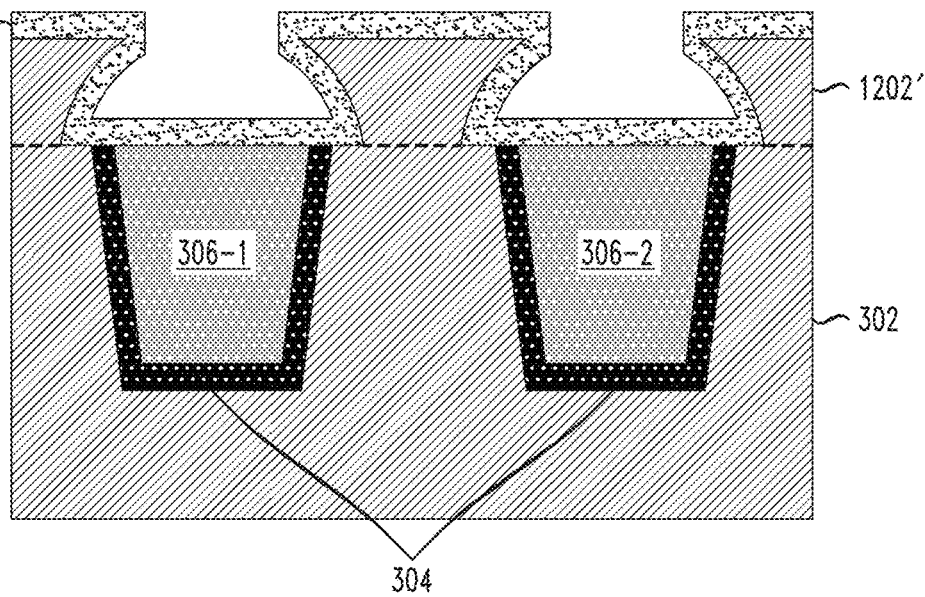
FIG. 15 depicts a side cross-sectional view of the FIG. 14 structure following conformal deposition of an etch stop liner, according to an embodiment of the invention.

FIG. 15 shows a side cross-sectional view 1500 of the FIG. 14 structure following conformal deposition of an etch stop liner 1210. The etch stop liner 1210 may be formed using any suitable conformal deposition process, such as PVD, ALS, CVD, PEALD, PECVD, etc. The etch stop liner 1210 may be formed of AlO$_x$, AlN or another suitable material such as other metal oxides or metal nitrides including TiOx, TiN, etc. The etch stop liner 1210 may have a uniform thickness in the range of about 5 nm to 20 nm.

FIG. 16 shows a side cross-sectional view 1600 of the FIG. 15 structure following formation of ILD layer 1212. The ILD layer 1212 may be a BEOL dielectric such as a porous silicate, carbon-doped oxides, silicon oxides, silicon nitrides, silicon oxy nitrides, etc. The ILD layer 1212 may be formed using processing similar to that described above with respect to ILD 312, resulting in pinch-off and formation of gaps 1213 as shown.

FIG. 17 shows a side cross-sectional view 1700 of the FIG. 16 structure following dual-damascene patterning of trenches and vias 1217-1 and 1217-2 (collectively, dual-damascene patterned trenches and vias 1217) using processing similar to that described above with respect to FIGS. 9 and 10. The resulting dual-damascene patterned trenches and vias 1217 may be of similar size and shape as that described with respect to trenches 315 and vias 317, with the exception that the dual-damascene patterned trenches and vias 1217 shown in FIG. 17 do not expose the top surface of the underlying metal lines 306. Instead, the dual-damascene patterning reveals portions of the etch stop liner 1210 formed over the underlying metal lines 306. As shown in FIG. 17, there is some corner removal of the etch stop liner 1210, which is a result of sputtering in the RIE processing even though the RIE chemistry is selected to the material of the etch stop liner 1210 and the bottom portion of the etch stop liner 1210 is not removed. Remaining portions of the etch stop liner 1210 are labeled as 1210' in FIG. 17 and subsequent figures.

FIG. 18 shows a side cross-sectional view 1800 of the FIG. 17 structure following removal of portions of the etch stop liner 1210 formed over the underlying metal lines 306, resulting in vias 1217-1' and 1217-2' (collectively, vias 1217'). A portion 1210" of the etch stop liner remains as shown. The portions of the etch stop liner 1210' formed over the underlying metal lines 306 may be removed using a suitable RIE chemistry or other suitable processing.

FIG. 19 shows a side cross-sectional view 1900 of the FIG. 18 structure following processing similar to that described above with respect to FIG. 11 to form additional metal liners 1214-1 and 1214-2 (collectively, metal liners 1214) on sidewalls of the dual-damascene patterned trenches and vias 1217', and to form metal vias 1216-1 and 1216-2 (collectively, metal vias 1216). The metal liners 1214 and metal vias 1216 may be formed of similar materials as the metal liners 314 and metal vias 316, respectively.

In some embodiments, a method of forming a semiconductor structure comprises forming one or more interconnect lines, the one or more interconnect lines comprising trenches of a first metal material surrounded by a first ILD layer. The method also comprises forming pillars of a second metal material different than the first metal material over the one or more interconnect lines utilizing a metal on metal growth process, and forming an etch stop dielectric layer, the pillars of the second metal material shaping the etch stop dielectric layer. The method further comprises forming one or more vias to the one or more interconnect lines, the one or more vias being fully aligned to the one or more interconnect lines using the etch stop dielectric layer.

The etch stop dielectric layer may define an inverted bowl shape over the first ILD layer surrounding each of the one or more interconnect lines. The etch stop dielectric layer may comprise the inverted bowl shape, and the method may further comprise forming a second ILD layer over the etch stop dielectric layer and surrounding the one or more vias.

Forming the etch stop dielectric layer may alternatively comprise forming a second ILD layer comprising the inverted bowl shape and forming the etch stop dielectric layer as a liner over the second ILD layer, where the method further comprises forming a third ILD layer over the etch stop dielectric layer and surrounding the one or more vias.

Forming the one or more interconnect lines may comprise forming a metal liner and forming the first metal material over the metal liner.

The first metal material may comprise at least one of Cu and W, and the second metal material may comprise at least one of TaN and TiN.

Forming the etch stop dielectric layer may comprise forming an etch stop dielectric material over the pillars of the second metal material, planarizing the etch stop dielectric material and the pillars of the second metal material, and removing the pillars of the second metal material. Forming the one or more vias may comprise forming a second ILD layer in (i) spaces exposed by removal of the pillars of the second metal material and (ii) over the etch stop dielectric layer, utilizing dual damascene patterning to remove portions of the second ILD layer to expose a top surface of the one or more interconnect lines, and forming the one or more vias by depositing a third metal material in the spaces formed by removal of the second ILD layer. The etch stop dielectric layer may comprise at least one of $AlO_x$ and AlN, and the second ILD layer may comprise an ultra low-k dielectric material.

Forming the etch stop dielectric layer may comprise forming a second ILD layer over the pillars of the second metal material, planarizing the second ILD layer and the pillars of the second metal material, removing the pillars of the second metal material, and forming the etch stop dielectric layer by depositing a liner of etch stop dielectric material over exposed top surfaces of the one or more interconnect lines and exposed surfaces of the second ILD layer. The etch stop dielectric material may comprise at least one of $AlO_x$ and AlN, and the second ILD layer may comprise an ultra low-k dielectric material. Forming the one or more vias may comprise forming a third ILD layer over the etch stop dielectric layer, utilizing dual damascene patterning to remove portions of the second ILD layer to expose a top surface of the etch stop dielectric layer formed over a top surface of the one or more interconnect lines, removing portions of the etch stop dielectric layer formed over the top surface of the one or more interconnect lines, and forming the one or more vias by depositing a third metal material in the spaces formed by removal of the portions of the third ILD layer and the etch stop dielectric layer.

Forming the one or more vias may further comprise forming a metal liner and forming a third metal material over the metal liner. The third metal material may be the same as the first metal material.

In some embodiments, a semiconductor structure comprises a first interconnect level comprising one or more first interconnect lines surrounded by a first ILD layer, a second interconnect level comprising one or more second interconnect lines, and one or more vias fully aligned to the one or more first interconnect lines in the first interconnect level and the one or more second interconnect lines in the second interconnect level through an etch stop dielectric layer. The etch stop dielectric layer defines an inverted bowl shape over the first ILD layer surrounding each of the one or more first interconnect lines.

The etch stop dielectric layer may comprise the inverted bowl shape, and the semiconductor structure may further comprise a second ILD layer disposed over the etch stop dielectric layer and surrounding the one or more vias.

The etch stop dielectric layer may alternatively comprise a liner disposed over a second ILD layer comprising the inverted bowl shape, and the semiconductor structure may further comprise a third ILD layer disposed over the etch stop dielectric layer and surrounding the one or more vias.

In some embodiments, an integrated circuit comprises an interconnect network comprising a first interconnect level comprising one or more first interconnect lines surrounded by a first ILD layer, a second interconnect level comprising one or more second interconnect lines, and one or more vias fully aligned to the one or more first interconnect lines in the first interconnect level and the one or more second interconnect lines in the second interconnect level through an etch stop dielectric layer. The etch stop dielectric layer defines an inverted bowl shape over the first ILD layer surrounding each of the one or more first interconnect lines.

The etch stop dielectric layer may comprise the inverted bowl shape, and the interconnect network may further comprise a second ILD layer disposed over the etch stop dielectric layer and surrounding the one or more vias.

The etch stop dielectric layer may alternatively comprise a liner disposed over a second ILD layer comprising the inverted bowl shape, and the interconnect network may further comprise a third ILD layer disposed over the etch stop dielectric layer and surrounding the one or more vias.

It should be understood that the various layers, structures, and regions shown in the figures are schematic illustrations that are not drawn to scale. In addition, for ease of explanation, one or more layers, structures, and regions of a type commonly used to form semiconductor devices or structures may not be explicitly shown in a given figure. This does not imply that any layers, structures, and regions not explicitly shown are omitted from the actual semiconductor structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the figures to denote the same or similar features, elements, or structures, and thus, a detailed explanation of the same or similar features, elements, or structures are not repeated for each of the figures. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error is present, such as ±5%, preferably less than 2% or 1% or less than the stated amount.

In the description above, various materials and dimensions for different elements are provided. Unless otherwise noted, such materials are given by way of example only and embodiments are not limited solely to the specific examples given. Similarly, unless otherwise noted, all dimensions are given by way of example and embodiments are not limited solely to the specific dimensions or ranges given.

Semiconductor devices and methods for forming the same in accordance with the above-described techniques can be employed in various applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings provided herein, one of ordinary skill in the art will be able to contemplate other implementations and applications of embodiments of the invention.

In some embodiments, the above-described techniques are used in connection with semiconductor devices that may require or otherwise utilize, for example, complementary metal-oxide-semiconductors (CMOS s), metal-oxide-semiconductor field-effect transistors (MOSFETs), and/or fin field-effect transistors (FinFETs). By way of non-limiting example, the semiconductor devices can include, but are not limited to CMOS, MOSFET, and FinFET devices, and/or semiconductor devices that use CMOS, MOSFET, and/or FinFET technology.

Various structures described above may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either: (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:
1. A semiconductor structure, comprising:
a first interconnect level comprising one or more first interconnect lines surrounded by a first interlayer dielectric layer;
a second interconnect level comprising one or more second interconnect lines;
one or more vias fully aligned to the one or more first interconnect lines in the first interconnect level and the one or more second interconnect lines in the second interconnect level through an etch stop dielectric layer;

wherein the etch stop dielectric layer defines an inverted bowl shape over the first interlayer dielectric layer surrounding each of the one or more first interconnect lines; and a second interlayer dielectric layer disposed in the inverted bowl shape between the etch stop dielectric layer and the one or more vias.

2. The semiconductor structure of claim 1, wherein the etch stop dielectric layer comprises the inverted bowl shape.

3. The semiconductor structure of claim 2, wherein the second interlayer dielectric layer is disposed over at least a portion of the first interlayer dielectric layer.

4. The semiconductor structure of claim 2, wherein the second interlayer dielectric layer is disposed over at least a portion of the one or more first interconnect lines.

5. The semiconductor structure of claim 1, wherein the etch stop dielectric layer comprises a liner.

6. The semiconductor structure of claim 5, wherein a first surface of the liner defines a cavity defined between the etch stop dielectric layer and the one or more vias.

7. The semiconductor structure of claim 6, further comprising a third interlayer dielectric layer surrounding a second surface of the liner opposite the first surface of the liner.

8. The semiconductor structure of claim 5, wherein the liner is disposed over at least a portion of the first interlayer dielectric layer.

9. The semiconductor structure of claim 5, wherein the liner is disposed over at least a portion of the one or more first interconnect lines.

10. The semiconductor structure of claim 1, wherein the etch stop dielectric layer comprises at least one of aluminum oxide and aluminum nitride, and wherein the second interlayer dielectric layer comprises at least one of a porous silicate, a carbon-doped oxide, a silicon oxide, a silicon nitride, and a silicon oxynitride.

11. An integrated circuit comprising:
an interconnect network comprising:
a first interconnect level comprising one or more first interconnect lines surrounded by a first interlayer dielectric layer;
a second interconnect level comprising one or more second interconnect lines;
one or more vias fully aligned to the one or more first interconnect lines in the first interconnect level and the one or more second interconnect lines in the second interconnect level through an etch stop dielectric layer;
wherein the etch stop dielectric layer defines an inverted bowl shape over the first interlayer dielectric layer surrounding each of the one or more first interconnect lines; and
a second interlayer dielectric layer disposed in the inverted bowl shape between the etch stop dielectric layer and the one or more vias.

12. The integrated circuit of claim 11, wherein the etch stop dielectric layer comprises the inverted bowl shape.

13. The integrated circuit of claim 11, wherein the etch stop dielectric layer comprises a liner.

14. The integrated circuit of claim 12, wherein the second interlayer dielectric layer is disposed over at least a portion of the first interlayer dielectric layer.

15. The integrated circuit of claim 12, wherein the second interlayer dielectric layer is disposed over at least a portion of the one or more first interconnect lines.

16. The integrated circuit of claim 13, wherein a first surface of the liner defines a cavity defined between the etch stop dielectric layer and the one or more vias.

17. The integrated circuit of claim 16, further comprising a third interlayer dielectric layer surrounding a second surface of the liner opposite the first surface of the liner.

18. The integrated circuit of claim 13, wherein the liner is disposed over at least a portion of the first interlayer dielectric layer.

19. The integrated circuit of claim 13, wherein the liner is disposed over at least a portion of the one or more first interconnect lines.

20. The integrated circuit of claim 13, wherein the etch stop dielectric layer comprises at least one of aluminum oxide and aluminum nitride, and wherein the second interlayer dielectric layer comprises at least one of a porous silicate, a carbon-doped oxide, a silicon oxide, a silicon nitride, and a silicon oxynitride.

* * * * *